United States Patent [19]

Kameyama et al.

[11] Patent Number: 5,183,768
[45] Date of Patent: Feb. 2, 1993

[54] METHOD OF FABRICATING SEMICONDUCTOR DEVICE BY FORMING DOPED REGIONS THAT LIMIT WIDTH OF THE BASE

[75] Inventors: Shuichi Kameyama, Itami; Hiroshi Shimomura; Kazuya Kikuchi, both of Osaka, all of Japan

[73] Assignee: Matsushita Electric Industrial Co., Ltd., Japan

[21] Appl. No.: 729,965

[22] Filed: Jul. 15, 1991

Related U.S. Application Data

[62] Division of Ser. No. 503,603, Apr. 3, 1990, abandoned.

[30] Foreign Application Priority Data

Apr. 4, 1989 [JP] Japan ................................. 1-85411

[51] Int. Cl.⁵ ......................................... H01L 21/265
[52] U.S. Cl. ............................ 437/26; 437/31; 437/35; 437/80; 148/DIG. 10; 148/DIG. 143
[58] Field of Search ............... 437/26, 35, 80, 31; 148/DIG. 143

[56] References Cited

U.S. PATENT DOCUMENTS 3,913,123 10/1975 Masaki et al. ...................... 357/34
4,267,557 5/1981 Muramoto et a. ................... 357/20

FOREIGN PATENT DOCUMENTS 354765A 2/1990 European Pat. Off. ............. 357/34
0105324 8/1980 Japan ................................. 437/26

OTHER PUBLICATIONS

"gigabit Logic Bipolar Technology: Advanced Super Self-Aligned Process Technology," *Electronics Letters*, vol. 19, No. 8 (Apr. 14, 1983), pp. 283-284.
Konaka et al., "A20 ps/G Si Bipolar IC Technology," *Japan Electronic Information Communication Society*, pp. 1-330 to 1-331.
"A Sub-30psac Si Bipolar LSI Technology", Gomi et al., IEEE Publication dated 1988, pp. 744-747.

Primary Examiner—Olik Chaudhuri
Assistant Examiner—Long Pham
Attorney, Agent, or Firm—Lowe, Price, LeBlanc & Becker

[57] ABSTRACT

A first semiconductor region is of a first conduction type and forms a transistor collector. A second semiconductor region is of a second conduction type and forms a transistor base. The second semiconductor region extends in the first semiconductor region. A third semiconductor region is of the first conduction type and forms a transistor emitter. The third semiconductor region extends in the second semiconductor region. A fourth semiconductor region is of the first conduction type and has a first portion and a second portion. The first portion extends in a part of the first semiconductor region below an edge of the third semiconductor region, and the second portion extends from the first semiconductor region into a part of the second semiconductor region outward of the edge of the third semiconductor region to limit a width of the transistor base.

5 Claims, 9 Drawing Sheets

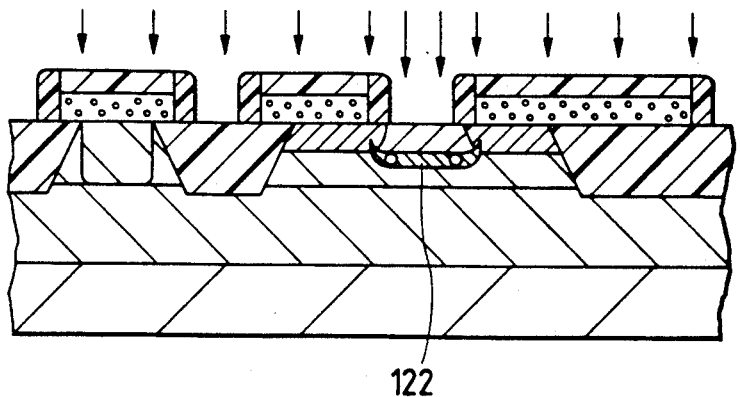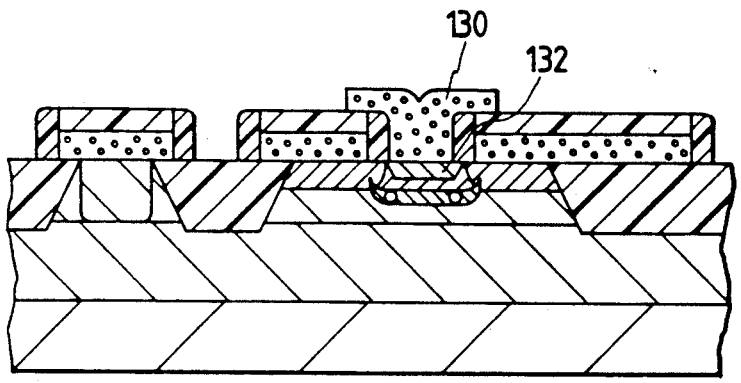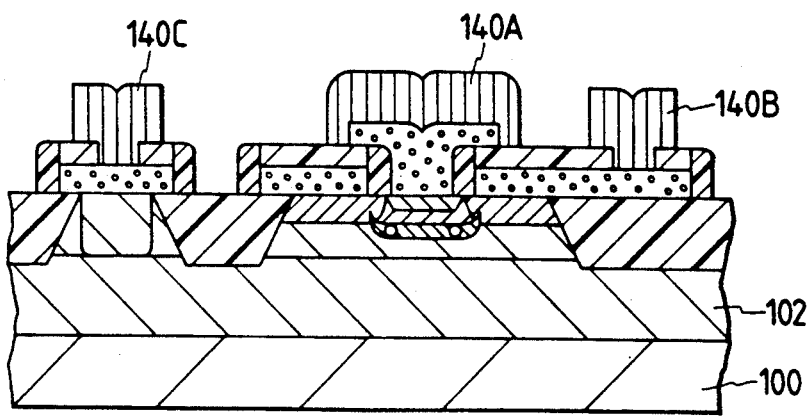

METHOD OF FABRICATING SEMICONDUCTOR DEVICE BY FORMING DOPED REGIONS THAT LIMIT WIDTH OF THE BASE

This application is a division of application Ser. No. 07/503, 503 filed Apr. 3, 1990 now abandoned.

BACKGROUND OF THE INVENTION

This invention relates to a semiconductor device such as a bipolar transistor, ICs, or LSIs. This invention also relates to a method of fabricating such a semiconductor device.

Various self-aligned process technologies have been developed to realize Si bipolar ICs which can operate at high speeds. The self-aligned process technologies enable finer structures of ICs, and smaller parasitic capacitances and resistances of transistors.

ELECTRONICS LETTERS, Apr. 14, 1983, Vol. 19 No. 8, pages 283–284, discloses a practical bipolar logic circuit which has been made with advanced super self-aligned process technology.

The digest of papers in the National Meeting 1987 of the semiconductor and material part of Japan Electronic Information Communication Society, pages 1-330 to 1-331, discloses a revised version of the advanced super self-aligned process technology. In this revised version, phosphorus ions are selectively implanted into only collector regions immediately below emitter regions and thus the profile of intrinsic base-collector impurities is controlled so that a selectively ion-implanted collector (SIC) is formed. ICs of such a SIC structure have advantages such as narrower base widths, higher collector cut-off frequencies, higher current densities, and lower intrinsic base resistances. These advantages enable higher IC operation speeds. As will be explained later, this revised version still has a problem.

SUMMARY OF THE INVENTION

It is an object of this invention to provide an excellent semiconductor device.

It is another object of this invention to provide an excellent method of fabricating a semiconductor device.

According to a first aspect of this invention, a semiconductor device comprises a first semiconductor region being of a first conduction type and forming a transistor collector; a second semiconductor region being of a second conduction type and forming a transistor base, the second semiconductor region extending in the first semiconductor region; a third semiconductor region being of the first conduction type and forming a transistor emitter, the third semiconductor region extending in the second semiconductor region; and a fourth semiconductor region being of the first conduction type having a first, portion and a second portion, wherein the first portion extends in a part of the first semiconductor region below an edge of the third semiconductor region, and the second portion extends from the first semiconductor region into a part of the second semiconductor region outward of the edge of the third semiconductor region to limit a width of the transistor base.

According to a second aspect of this invention, a semiconductor device comprises a first semiconductor region being of a first conduction type and forming a transistor collector; a second semiconductor region being of a second conduction type and forming a transistor base, the second semiconductor region extending in the first semiconductor region; a third semiconductor region being of the first conduction type and forming a transistor emitter, the third semiconductor region extending in the second semiconductor region; a fourth semiconductor region being of the first conduction type and having a first portion and a second portion, wherein the first portion extends in a part of the first semiconductor region below an edge of the third semiconductor region, and the second portion extends from the first semiconductor region into a part of the second semiconductor region outward of the edge of the third semiconductor region to limit a width of the transistor base; and a non-crystalline conductor having an opening for the transistor emitter and being electrically connected to the second semiconductor region.

According to a third aspect of this invention, a method of fabricating a semiconductor device comprises the steps of forming a first semiconductor region of a first conduction type, the first semiconductor region forming a transistor collector; forming a second semiconductor region in the first semiconductor region, the second semiconductor region being of a second conduction type and forming a transistor base; forming a mask on the second semiconductor region, the mask having an opening for a transistor emitter; forming a third semiconductor region in an emitter-forming area within the second semiconductor region, the third semiconductor region being of the first type and forming a transistor emitter; and implanting ions into the first and second semiconductor regions via the opening along a direction inclined with respect to a surface of the second semiconductor region and thereby forming a fourth semiconductor region of the first conduction type, the fourth semiconductor region having a first portion and a second portion, wherein the first portion extends in a part of the first semiconductor region below and edge of the emitter-forming area within the second semiconductor region, and the second portion extends from the first semiconductor region into a part of the second semiconductor region outward of the edge of the emitter-forming area to limit a width of the transistor base.

According to a fourth aspect of this invention, a method of fabricating a semiconductor device comprises the steps of forming a first semiconductor region of a first conduction type, the first semiconductor region forming a transistor collector; forming a non-crystalline conductor film on the first semiconductor region; forming an opening through the conductor film; forming a second semiconductor region in the first semiconductor region, the second semiconductor region being of a second conduction type and forming a transistor base, the second semiconductor region being electrically connected to the conductor film; forming a third semiconductor region in an emitter-forming area within the second semiconductor region, the third semiconductor region being of the first type and forming a transistor emitter; and implanting ions into the first and second semiconductor regions via the opening along a direction inclined with respect to a surface of the second semiconductor region and thereby forming a fourth semiconductor region of the first conduction type, the fourth semiconductor region having a first portion and a second portion, wherein the first portion extends in a part of the first semiconductor region below an edge of the emitter-forming area within the second semiconductor region, and the second portion extends from the first semiconductor region into a part of the second semiconductor region outward of the edge of the emitter-forming area to limit a width of the transistor base.

BRIEF DESCRIPTION OF THE DRAWINGS

FIGS. 5(a)-5(f) are sectional views of a bipolar NPN transistor at different stages during the fabrication which is performed on the basis of a method according to a fifth embodiment of this invention.

FIG. 6 is a sectional view of a bipolar NPN transistor at a stage during the fabrication which is performed on the basis of a method according to a seventh embodiment of this invention.

Like and corresponding portions are denoted by the same reference characters throughout the drawings.

DESCRIPTION OF THE PRIOR ART

Before the detailed description of this invention, the prior art will be explained hereinafter for a better understanding of this invention.

Figure 9A:
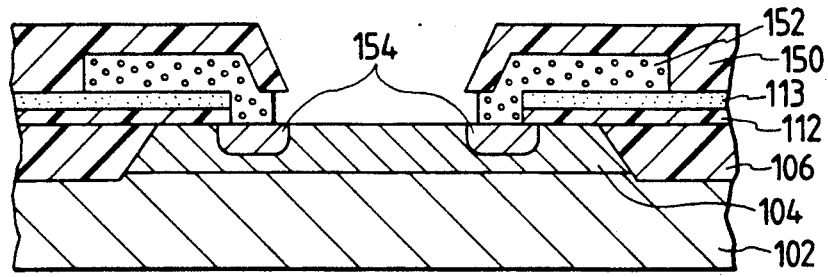
FIGS. 9(a)-9(c) are sectional views of a prior-art bipolar NPN transistor at different stages during the fabrication which is performed on the basis of a prior-art method.

A description will be made on the fabrication of a prior-art IC including NPN bipolar transistors of the SIC structure. For the simplicity, the description will be directed to only part of one transistor. At a given stage of the fabrication, as shown in FIG. 9(a), an n-type epitaxial layer 104, a silicon dioxide films 106, 112, and 150, a silicon nitride film 113, a thick polysilicon film 152, and a p+-type semiconductor region 154 are formed on a substrate 102 of an n+-type single crystal. The polysilicon film 152 has an opening via which the epitaxial layer 104 is exposed. The silicon dioxide film 106 functions to isolate adjacent elements. The polysilicon film 152 will be a base-leading electrode. The p+-type semiconductor region 154 will be an outer (extrinsic) base region.

Figure 9B:
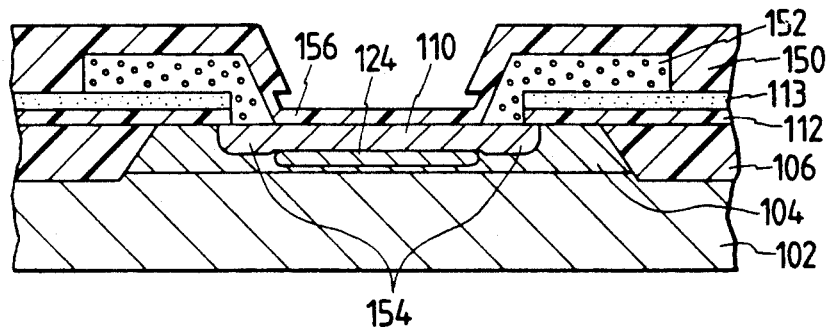

Subsequently, as shown in FIG. 9(b), the epitaxial layer 104 is thermally oxidized to form an oxide film 156 having a thickness of 70 nm. Boron ions are implanted into the epitaxial layer 104 through the oxide film 156 to form a p-type base region 110. By using the structure that the outer base region 154 is covered by the thick polysilicon film 152 but the inner (intrinsic) base region 110 inward of the outer base region 154 is uncovered from the polysilicon film 152, phosphorus ions are implanted in a self-aligned manner into a region which extends immediately below an emitter region and near a base-collector junction region. The phosphorous ion implantation forms an $n^{30}$-type semiconductor region 124 corresponding to a SIC region. Since a very high speed bipolar device has a tin base layer, the n+-type semiconductor region 124 can be easily formed by performing the ion implantation at 150–200 KeV. The n+-type semiconductor region 124 has a high impurity concentration (density). Since the n+-type semiconductor region 124 having a high impurity concentration resides only in the region immediately below the emitter region, the outer base region causes only a small increase in a collector capacitance.

Figure 9C:
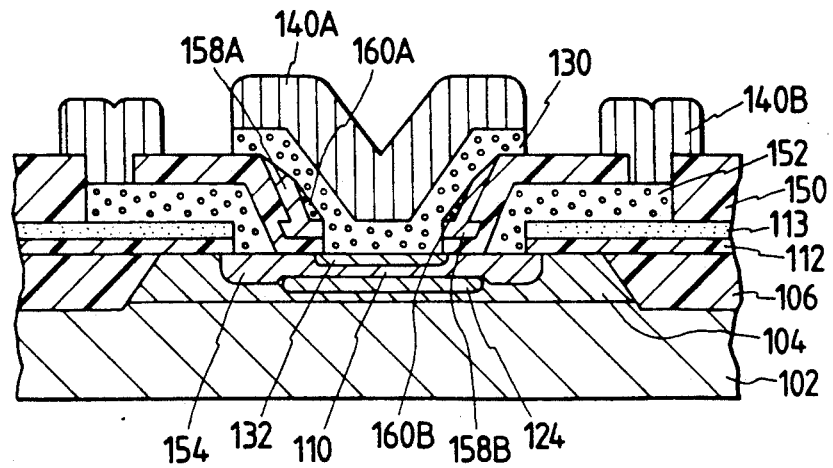

As shown in FIG. 9(c), a silicon dioxide film 158 having a thickness of 200 nm is formed by chemical vapor deposition (CVD) on the silicon dioxide layers 150 and 156. Then, a polysilicon film 160 having a thickness of about 200–400 nm is formed on the silicon dioxide film 158 by CVD. An anisotropic dry etching process removes unnecessary parts of the silicon dioxide film 158 and the polysilicon film 160, leaving necessary parts of the silicon dioxide film 158 and the polysilicon film 160 as silicon dioxide films 158A and 158B and polysilicon films 160A and 160B around the opening of the polysilicon film 152. Then, a window for forming an emitter region is provided. An n+-type emitter 132, an opening for a base contact, a base metal electrode 140B, and an emitter metal electrode 140A are formed in a way similar to a conventional process of fabricating a transistor, so that an NPN transistor is completed. The n+-type semiconductor region 124, that is, the SIC region, functions to suppress a Kirk effect.

Figure 10:
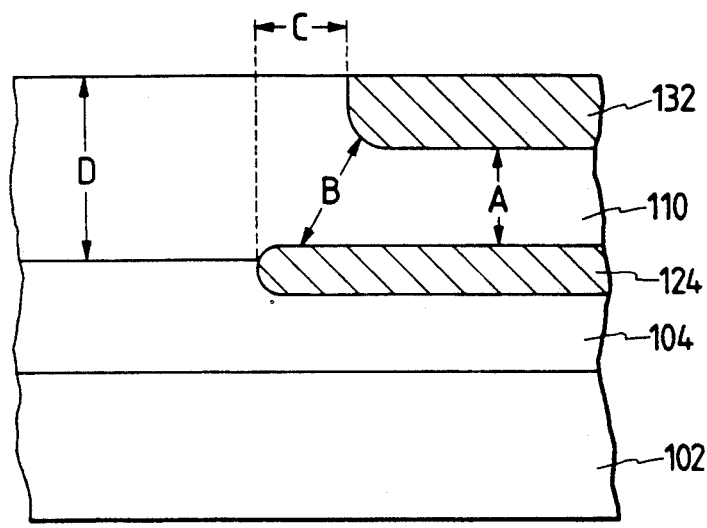
FIG. 10 is a sectional view of a part of the prior-art bipolar NPN transistor of FIGS. 9(a)-9(c).

FIG. 10 is an enlarged view of the SIC structure. The Kirk effect is a phenomenon that, in the presence of a large collector current, the effective base width A increases toward the n-type epitaxial layer 104. The Kirk effect is suppressed by the n+-type semiconductor region 124 which has the high impurity concentration (density) and which extends immediately below the p-type base region 110.

In the case of a large collector current, the intrinsic base resistance of the region immediately below the n+-type emitter region 132 causes the collector current concentrates on the outer part of the emitter region 132, and components of the collector current advance toward the outer part of the emitter region 132. In order to adequately suppress the Kirk effect caused by the collector current which concentrates on the outer part of the emitter region 132, it is necessary to extend the n+-type semiconductor region 124 outward beyond the emitter region 132 by a sufficiently large distance C.

The prior art transistor including the SIC structure has a problem as follows. In the case of a large collector current, the concentration of the collector current on the outer part of the emitter region 132 increases the base width from the intrinsic width A to an effective width B. The increased base width lowers the collector cut-off frequency.

DESCRIPTION OF THE FIRST PREFERRED EMBODIMENT

Figure 1:
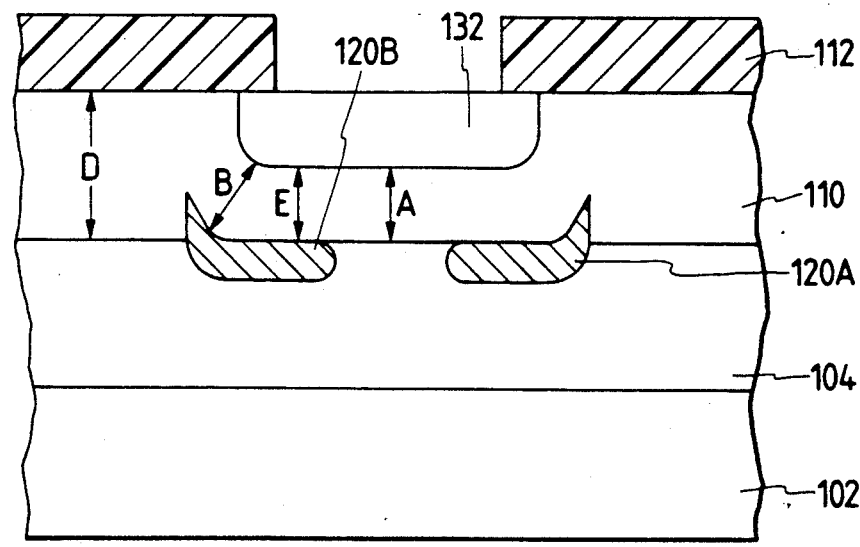
FIG. 1 is a sectional view of a bipolar NPN transistor according to a first embodiment of this invention.

With reference to FIG. 1, an NPN transistor includes a n+-type buried region 102 on which an n-type epitaxial layer 104 of a single crystal extends. The epitaxial layer 104 forms a collector. A p-type base region 110 extends on the epitaxial layer 104. A silicon dioxide film 112 extends on the base region 110. The silicon dioxide film 112 has an opening or a window. The base region 110 has an island semiconductor region adjoining the opening of the silicon dioxide film 112. An n+-type emitter region 132 occupies the island region in the base region 110 and adjoins the opening of the silicon dioxide film 112. The part of the base region 110 which extends between a central part of the emitter region 132 and the epitaxial layer 104 has a predetermined thickness or depth determining an intrinsic base width A.

Semiconductor regions (SIC regions) 120A and 120B of the n+-type extend at and around the boundary between the epitaxial layer 104 and the base region 110. Main parts of the SIC regions 120A and 120B extend in the epitaxial layer 104 directly below an outer part of the emitter region 132. The SIC regions 120A and 120B extend outward beyond the outer part of the emitter region 132. The SIC regions 120A and 120B have upper parts which extend from the main parts thereof into the base region 110 residing outward of the emitter region 132. The surfaces of the SIC regions 120A and 120B which oppose the outer part of the emitter region 132 are shaped so as to conform to the outer part of the emitter region 132. Therefore, the opposing surfaces of the emitter region 132 and each of the SIC regions 120A and 120B are substantially uniformly distant from each other or are separated from each other by a substantially uniform distance. In addition, the parts of the base region 110 which are sandwiched between the emitter region 132 and the SIC regions 120A and 120B have a substantially uniform thickness or depth measured along the distance between the emitter region 132 and the SIC regions 120A and 120B. The thickness of the parts of the base region 110 sandwiched between the emitter region 132 and the SIC regions 120A and 120B is chosen to be approximately equal to the thickness of the part of the base region 110 between the central part of the emitter region 132 and the epitaxial layer 104.

As understood from the previous description, each of the SIC regions 120A and 120B has a first portion and a second portion. The first portion extends in a part of the collector region below an edge of the emitter region, and the second portion extends from the collector region into a part of the base region outward of the edge of the emitter region to limit a width of the transistor base.

In the case of a large collector current, the intrinsic base resistance of the region immediately below the n+-type emitter 132 causes the collector current concentrates on an outer part of the emitter region 132, and components of the collector current advances toward the outer part of the emitter region 132. The concentration of the collector current on the outer part of the emitter region 132 changes the base width from the intrinsic width A to an effective width B determined by the parts of the base region 110 sandwiched between the emitter region 132 and the SIC regions 120A and 120B. Since the thickness of the parts of the base region 110 sandwiched between the emitter region 132 and the SIC regions 120A and 120B is approximately equal to the thickness of the part of the base region 110 between the central part of the emitter region 132 and the epitaxial layer 104, the effective base width B is approximately equal to the intrinsic base width A. Accordingly, in the case of a large collector current, the effective base width B is prevented from significantly increasing and thus the collector cut-off frequency is kept high.

The depth E of the part of the base region 110 between the outer part and the central part thereof may be larger than the distance determining the intrinsic base distance A as long as the distance determining the effective base width B is approximately equal to the distance determining the intrinsic base distance A.

DESCRIPTION OF THE SECOND PREFERRED EMBODIMENT

Figure 2:
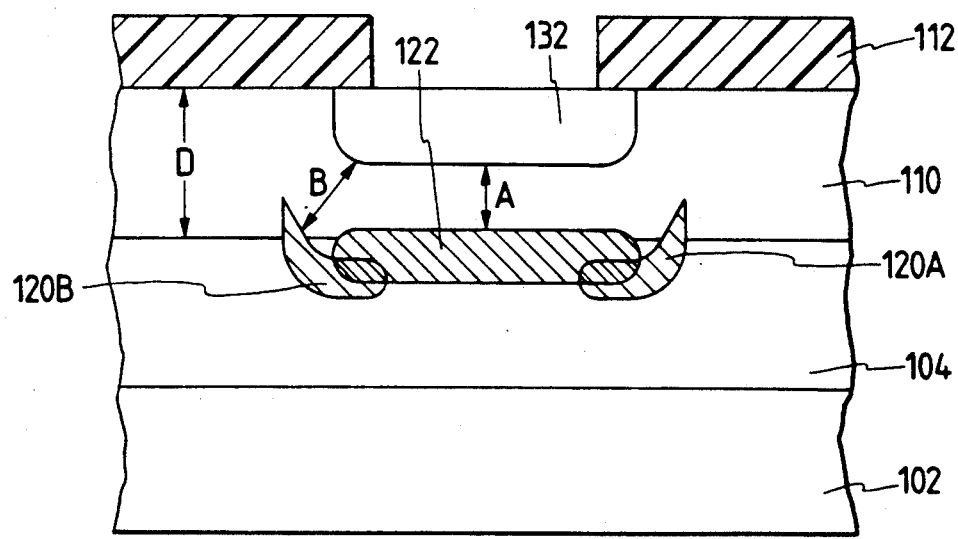
FIG. 2 is a sectional view of a bipolar NPN transistor according to a second embodiment of this invention.

FIG. 2 shows a second embodiment of this invention which is similar to the embodiment of FIG. 1 except that an n+-type semiconductor region or a SIC region 122 is additionally provided at the boundary between an epitaxial layer 104 and a base region 110. The n+-type semiconductor region 122 aligns with an emitter region 132 and extends directly below the emitter region 132. The Kirk effect can be suppressed in the area residing below and outward of the emitter region 132.

DESCRIPTION OF THE THIRD PREFERRED EMBODIMENT

FIGS. 3(a)-3(d) relate to a method of fabricating NPN transistors according to a third embodiment of this invention. For the simplicity, the following description will be directed to only a part of one transistor.

Figure 3A:
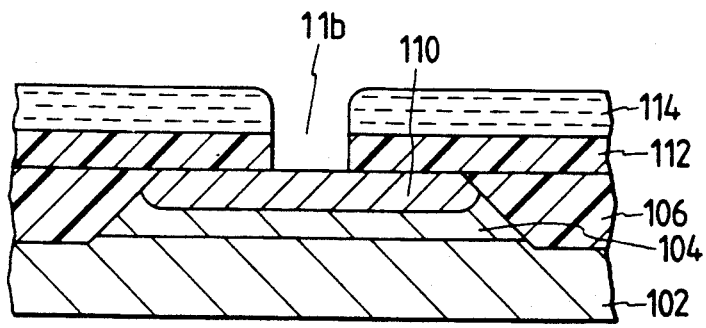
FIGS. 3(a)-3(d) are sectional views of a bipolar NPN transistor at different stages during the fabrication which is performed on the basis of a method according to a third embodiment of this invention.

As shown in FIG. 3(a), an n-type semiconductor layer 104 was formed on an n+-type semiconductor region 102 by epitaxial growth. The epitaxial layer 104 formed a collector. The semiconductor region 102 was made of a single crystal. Element-isolation films 106 of silicon dioxide were formed on the semiconductor region 102 by a LOCOS method. The oxide films 106 had a thickness of about 1.3 micrometers. Boron ions were implanted into the epitaxial layer 104 to form a p-type base region 110. The base region 110 extended between the element-isolation oxide films 106. The dose amount of the implanted boron was $10^{13}-10^{14}$ cm$^{-2}$. A silicon dioxide film 112 was formed on the base region 110 and the oxide films 106 by a thermally oxidizing process and a CVD method. Then, an opening 116 for an emitter contact window was formed through the oxide film 112 by an ordinary etching process using a resist 114 of a predetermined pattern.

Figure 3B:
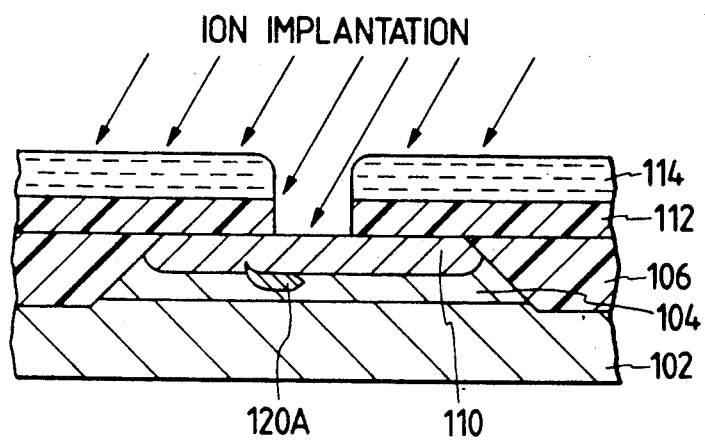

As shown in FIG. 3(b), phosphorus ions were implanted into a region below a left-hand edge of an emitter-forming area within the base region 110 to form a first n+-type semiconductor region or a first SIC region 120A. The phosphorus ion implantation was of the tilt angle type with an inclination of 8 or higher degrees, for example, 20 degrees. The phosphorus ion implantation was performed at an acceleration energy of about 200 KeV. The dose amount of the implanted phosphorus ions was $10^{12}-10^{14}$ cm$^{-2}$. The first SIC region 120A extended at and around the boundary between the epitaxial layer 104 and the base region 110.

During the phosphorus ion implantation, a part of the phosphorus ion beam reached an area around the boundary between the epitaxial layer 104 and the base region 110 through the edge of the silicon dioxide film 112 which defined the opening 116. This edge of the silicon dioxide film 112 had a varying effective thickness with respect to the inclined phosphorus ion beam so that the resultant SIC region 120A had a curved shape with an edge intruding upward into the base region.

Figure 3C:
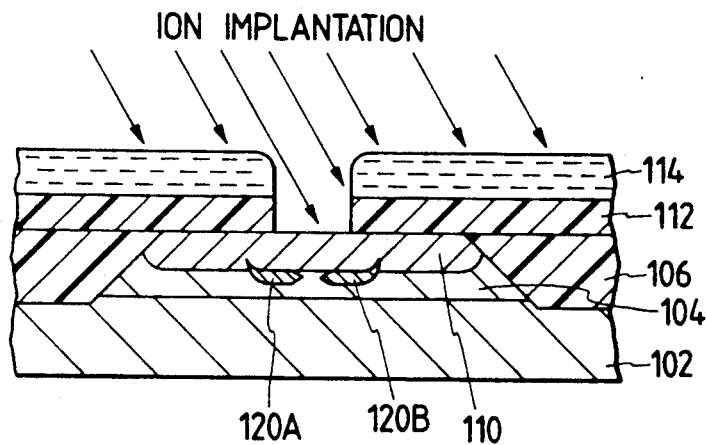

After the formation of the first SIC region 120A, a second SIC region was formed as follows. As shown in FIG. 3(c), phosphorus ions were implanted into a region below a right-hand edge of the emitter-forming area within the base region 110 to form a second n+-type semiconductor region or a second SIC region 120B. The phosphorus ion implantation was of the tilt angle type with an inclination of 8 or higher degrees, for example, 20 degrees. The phosphorus ion implantation was performed at an acceleration energy of about 200 KeV. The dose amount of the implanted phosphorus ions was $10^{12}$–$10^{14}$ cm$^{-2}$. The second SIC 120B extended at and around the boundary between the epitaxial layer 104 and the base region 110. The second SIC region 120B had a curved shape similar to the curved shape of the first SIC region 120A. The inclination of the phosphorus ion implantation related to the second SIC region 120B was equal in degree but opposite in sign to the inclination of the phosphorus ion implantation related to the first SIC region 120A. For example, the inclination of the phosphorus ion implantation related to the second SIC region 120B was +20 degrees with respect to the vertical direction perpendicular to the main horizontal surface of the base region 110 while the inclination of the phosphorus ion implantation related to the first SIC region 120A was −20 degrees with respect to the vertical direction perpendicular to the main horizontal surface of the base region 110.

As described previously, the first and second SIC regions 120A and 120B extended at and around the boundary between the epitaxial layer 104 and the base region 110. Main parts of the SIC regions 120A and 120B extended in the epitaxial layer 104 directly below an outer part of the emitter-forming area. The SIC regions 120A and 120B extended outward beyond the outer part of the emitter-forming area. The SIC regions 120A and 120B had upper parts which extended from the main parts thereof into the base region 110 residing outward of the emitter-forming area.

In the case of a rectangular stripe emitter region, it is sufficient that two SIC regions are formed by respective inclined ion implantation. In the case of a square emitter region, four SIC regions are formed at locations below the edges of the square emitter region by respective inclined ion implantations.

Figure 3D:
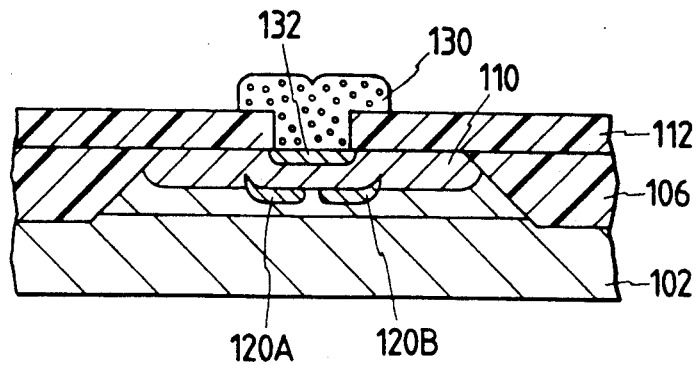

After the formation of the SIC regions 120A and 120B, the resist 114 was removed. Then, as shown in FIG. 3(d), a polysilicon electrode 130 filling the window 116 was formed, and arsenic ions were implanted into the polysilicon layer 130 and a heat treatment was performed to form an n+-type semiconductor region 132 in the area within the base region 110 which extends immediately below the window 116. The dose amount of the implanted arsenic ions was about $10^{16}$ cm$^{-2}$. The semiconductor region 132 corresponds to an emitter. Finally, an NPN bipolar transistor having a structure of FIG. 1 was obtained.

DESCRIPTION OF THE FOURTH PREFERRED EMBODIMENT

FIGS. 4(a)-4(d) relate to a method of fabricating NPN transistors according to a fourth embodiment of this invention. For the simplicity, the following description will be directed to only a part of one transistor.

Figure 4A:
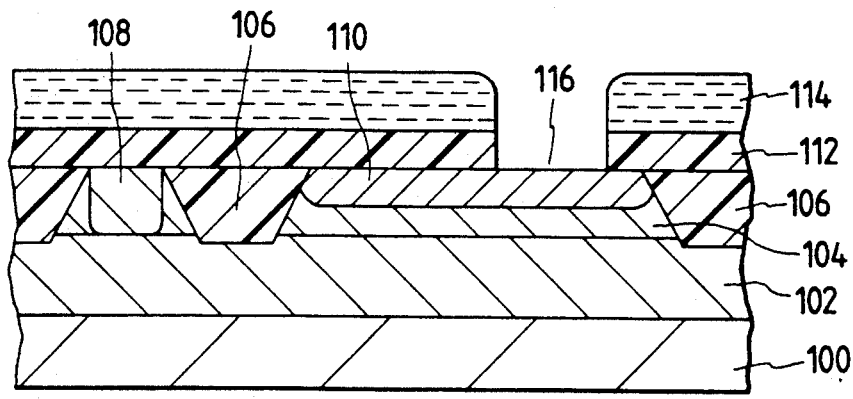
FIGS. 4(a)-4(d) are sectional views of a bipolar NPN transistor at different stages during the fabrication which is performed on the basis of a method according to a fourth embodiment of this invention.

As shown in FIG. 4(a), an n+-type buried region 102 was formed on a substrate 100 of a single crystal of a p-type semiconductor. Then, an n-type semiconductor layer 104 of a single crystal was formed on the buried region 102 by epitaxial growth. The epitaxial layer 104 formed a collector. Element-isolation films 106 of silicon dioxide were formed on the buried region 102 by a LOCOS method. The oxide films 106 had a thickness of about 1.3 micrometers. Phosphorus ions were implanted into a part of the epitaxial layer 104 to form an n+-type collector-leading region 108, and boron ions were implanted into the epitaxial layer 104 to form a p-type base region 110. The base region 110 extended between the element-isolation oxide films 106. A silicon dioxide film 112 was formed on the base region 110, the oxide films 106, and the collector-leading region 108 by a thermally oxidizing process and a CVD method. Then, an opening 116 for an emitter contact window was formed through the oxide film 112 by an ordinary etching process using a resist 114 of a predetermined pattern.

Figure 4B:
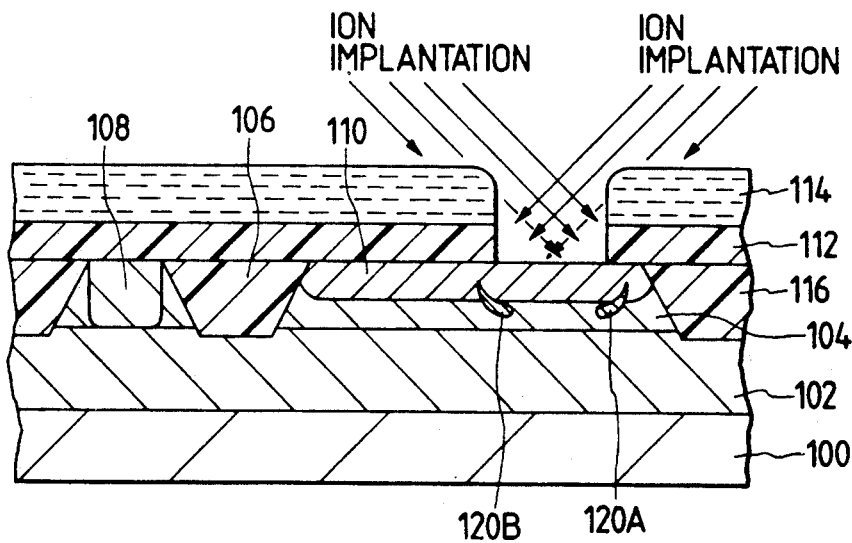

As shown in FIG. 4(b), phosphorus ions were implanted via the opening 116 into a region below a left-hand edge of an emitter-forming area within the base region 110 to form a first n+-type semiconductor region or a first SIC region 120A. The phosphorus ion implantation was of the tilt angle type with an inclination of 8 or higher degrees, for example, 20 degrees. The phosphorus ion implantation was performed at an acceleration energy of about 200 KeV. The first SIC region 120A extended at and around the boundary between the epitaxial layer 104 and the base region 110.

During the phosphorus ion implantation, a part of the phosphorus ion beam reached an area around the boundary between the epitaxial layer 104 and the base region 110 through the edge of the silicon dioxide film 112 which defined the opening 116. This edge of the silicon dioxide film 112 had a varying effective thickness with respect to the inclined phosphorus ion beam so that the resultant SIC region 120A had a curved shape with an edge intruding upward into the base region.

After the formation of the first SIC region 120A, a second SIC region was formed as follows. As shown in FIG. 4(b), phosphorus ions were implanted into a region below a right-hand edge of the emitter-forming area within the base region 110 to form a second n+-type semiconductor region or a second SIC region 120B. The phosphorus ion implantation was of the tilt angle type with an inclination of 8 or higher degrees, for example, 20 degrees. The phosphorus ion implantation was performed at an acceleration energy of about 200 KeV. The second SIC region 120B had a curved shape similar to the curved shape of the first SIC region 120A. The second SIC region 120B extended at and around the boundary between the epitaxial layer 104 and the base region 110. The inclination of the phosphorus ion implantation related to the second SIC region 120B was equal in degree but opposite in sign to the inclination of the phosphorus ion implantation related to the first SIC region 120A.

As described previously, the first and second SIC regions 120A and 120B extended at and around the boundary between the epitaxial layer 104 and the base region 110. Main parts of the SIC regions 120A and 120B extended in the epitaxial layer 104 directly below an outer part of the emitter-forming area. The SIC regions 120A and 120B extended outward beyond the outer part of the emitter-forming area. The SIC regions 120A and 120B had upper parts which extended from the main parts thereof into the base region 110 residing outward fo the emitter-forming area.

Figure 4C:
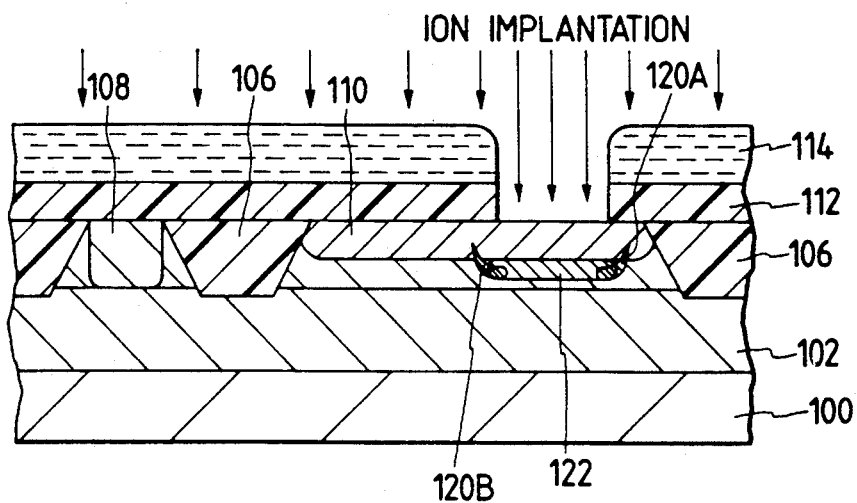

After the formation of the SIC regions 120A and 120B, as shown in FIG. 4(c), phosphorus ions were implanted into the epitaxial layer 104 via the window 116 to form an n+-type semiconductor region or a SIC region 122 in the part of the epitaxial layer 104 which extended directly below the emitter-forming area.

Figure 4D:
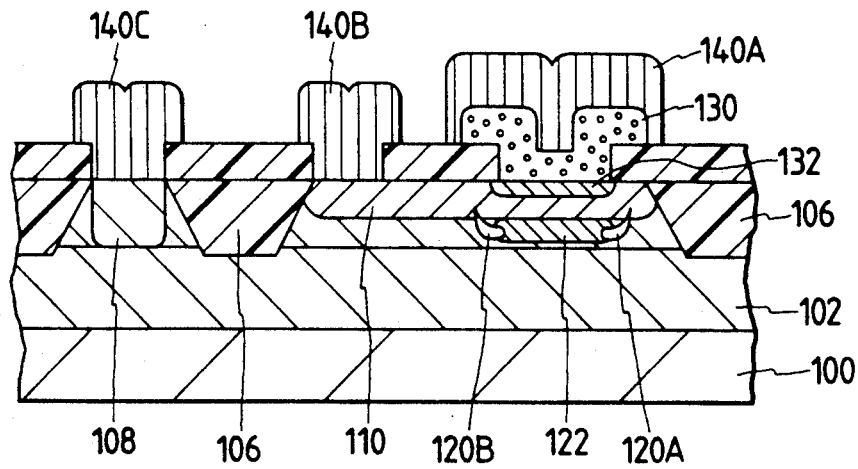

After the formation of the SIC region 122, the resist 114 was removed. Then, as shown in FIG. 4(d), a polysilicon electrode 130 filling the window 116 was formed, and arsenic ions were implanted into the polysilicon layer 130 and a heat treatment was performed to form an n+-type semiconductor region 132 in the area within the base region 110 which extended immediately below the window 116. The semiconductor region 132 corresponds to an emitter. Subsequently, an emitter metal electrode 140A, a base metal electrode 140B, and a collector metal electrode 140C were formed in a conventional way. Finally, an NPN bipolar transistor having a structure of FIG. 2 was obtained.

DESCRIPTION OF THE FIFTH PREFERRED EMBODIMENT

FIGS. 5(a)-5(f) relate to a method of fabricating NPN transistors according to a fifth embodiment of this invention. For the simplicity, the following description will be directed to only a part of one transistor.

Figure 5A:
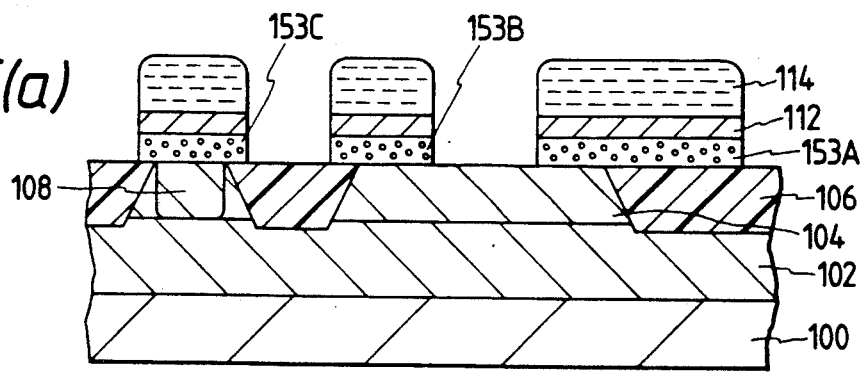

As shown in FIG. 5(a), an n+-type buried region 102 was formed on a substrate 100 of a single crystal of a p-type semiconductor. Then, an n-type semiconductor layer 104 of a single crystal was formed on the buried region 102 by epitaxial growth. The epitaxial layer 104 formed a collector. Element-isolation films 106 of silicon dioxide were formed on the buried region 102 by a LOCOS method. The oxide films 106 had a thickness of about 1.3 micrometers. Phosphorus ions were implanted into a part of the epitaxial layer 104 to form an n+-type collector leading region 108. Then, a conductor film 153 having a thickness of about 300 nm was deposited on the entire surfaces of the epitaxial layer 104, the element-isolation films 106, and the collector-leading region 108. The conductor film 153 was made of non-crystalline conductor material such as polysilicon. Boron ions were implanted into a base-forming region of the polysilicon film 153 while a resist pattern (not shown) produced by normal photolithography was used. The dose amount of the implanted boron ions was $10^{15}$–$10^{16}$ cm$^{-2}$. Then, a silicon dioxide film 112 having a thickness of about 250 nm was deposited on the polysilicon film 153. After the formation of the silicon dioxide film 112, a resist 114 of a predetermined pattern was formed by ordinary photolithography. The silicon dioxide film 112 and the polysilicon film 153 were etched to leave polysilicon films 153A, 153B, and 153C of predetermined patterns while the resist 114 was used as a mask.

Figure 5B:
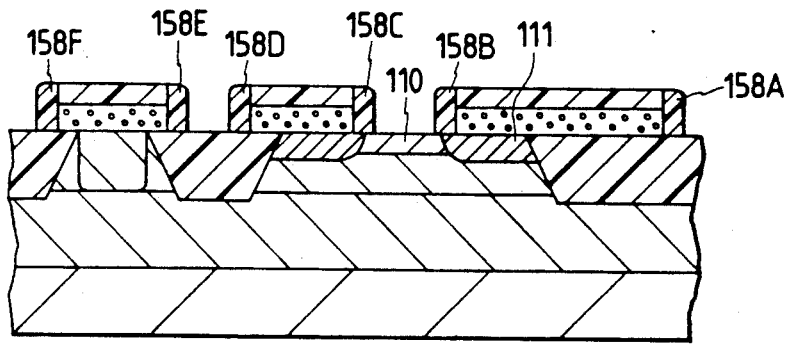

As shown in FIG. 5(b), boron ions were thermally diffused from the polysilicon films 153A and 153B into the epitaxial layer 104 to form p+-type base regions 111. Then, boron ions were implanted into the epitaxial layer 104 to form a p-type base region 110 while a resist of a predetermined pattern which was produced by ordinary photolithography was used as a mask. The dose amount of the implanted boron ions was $10^{12}$–$10^{14}$ cm$^{-2}$. The p-type base region 110 extends between the p+-type base regions 111. Then, a silicon dioxide film 158 was deposited on the entire surfaces of the semiconductor device body. Unnecessary parts of the silicon dioxide film 158 were removed by an anisotropic dry etching process to leave silicon dioxide films 158A, 158B, 158C, 158D, 158E, and 158F extending along the side surfaces of the polysilicon films 153A, 153B, and 153C. An emitter opening was defined between the silicon dioxide films 158B and 158C.

Figure 5C:
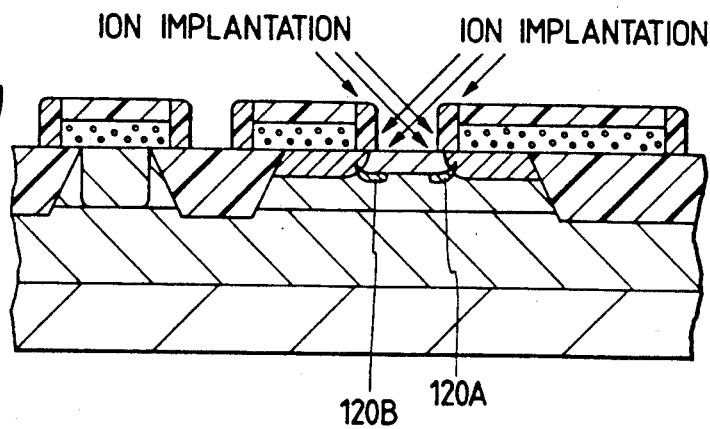

As shown in FIG. 5(c), phosphorus ions were implanted via the emitter opening into a region below a left-hand edge of an emitter-forming area within the base region 110 to form a first n+-type semiconductor region or a first SIC region 120A. The phosphorus ion implantation was of the tilt angle type with an inclination of 8 or higher degrees, for example, 20 degrees. The phosphorus ion implantation was performed at an acceleration energy of about 200 KeV. The first SIC region 120A extended at and around the boundary between the epitaxial layer 104 and the base region 110. The first SIC region 120A had a curved shape as in the third and fourth embodiments.

After the formation of the first SIC region 120A, a second SIC region was formed as follows. As shown in FIG. 5(c), phosphorus ions were implanted into a region below a right-hand edge of the emitter-forming area within the base region 110 to form a second n+-type semiconductor region or a second SIC region 120B. The phosphorus ion implantation was of the tilt angle type with an inclination of 8 or higher degrees, for example, 20 degrees. The phosphorus ion implantation was performed at an acceleration energy of about 200 KeV. The second SIC region 120B extended at and around the boundary between the epitaxial layer 104 and the base region 110. The second SIC region 120B had a curved shape as in the third and fourth embodiments. The inclination of the phosphorus ion implantation related to the second SIC region 120B was equal in degree but opposite in sign to the inclination of the phosphorus ion implantation related to the first SIC region 120A.

As described previously, the first and second SIC regions 120A and 120B extended at and around the boundary between the epitaxial layer 104 and the base region 110. Main parts of the SIC regions 120A and 120B extended in the epitaxial layer 104 directly below an outer part of the emitter-forming area. The SIC regions 120A and 120B extended outward beyond the outer part of the emitter-forming area. The SIC regions 120A and 120B had upper parts which extended from the main parts thereof into the base region 110 residing outward of the emitter-forming area.

After the formation of the SIC regions 120A and 120B, as shown in FIG. 5(d), phosphorus ions were implanted into the epitaxial layer 104 via the emitter opening to form an n+-type semiconductor region or a SIC region 122 in the part of the epitaxial layer 104 which extended directly below the emitter-forming area.

Then, as shown in FIG. 5(e), a polysilicon electrode 130 filling the window 116 was formed, and arsenic ions were implanted into the polysilicon electrode 130 and a heat treatment was performed to form an n+-type semiconductor region 132 in the area within the base region 110 which extended immediately below the emitter opening. The semiconductor region 132 corresponds to an emitter.

Subsequently, as shown in FIG. 5(f), an emitter metal electrode 140A, a base metal electrode 140B, and a collector metal electrode 140C were formed in a conventional way. Finally, an NPN bipolar transistor having a structure of FIG. 2 was obtained.

In the NPN transistor fabricated by the method of this embodiment, the polysilicon films 153A-153B formed leading electrodes electrically connected to the base region 111 so that the area of the base was small.

This embodiment may be modified as follows. In a first modification, immediately before the silicon dioxide film 158 is deposited on the entire surfaces of the semiconductor device body, the SIC regions 120A and 120B are formed by implanting phosphorus ions into the epitaxial layer 104 and the base region 110 via the emitter opening defined between the polysilicon films 153A and 153B. In a second modification, immediately before the silicon dioxide film 158 is deposited on the entire surfaces of the device body, the SIC region 122 is formed by implanting phosphorus ions into the epitaxial layer 104 and the base region 110 via the emitter opening defined between the polysilicon films 153A and 153B. In a third modification, the polysilicon film 153 is replaced by an amorphous silicon film or one of various polycide films.

DESCRIPTION OF THE SIXTH PREFERRED EMBODIMENT

A sixth embodiment of this invention is a modification of the third, fourth, and fifth embodiments. The sixth embodiment was carried out in view of the following fact.

Figure 6:
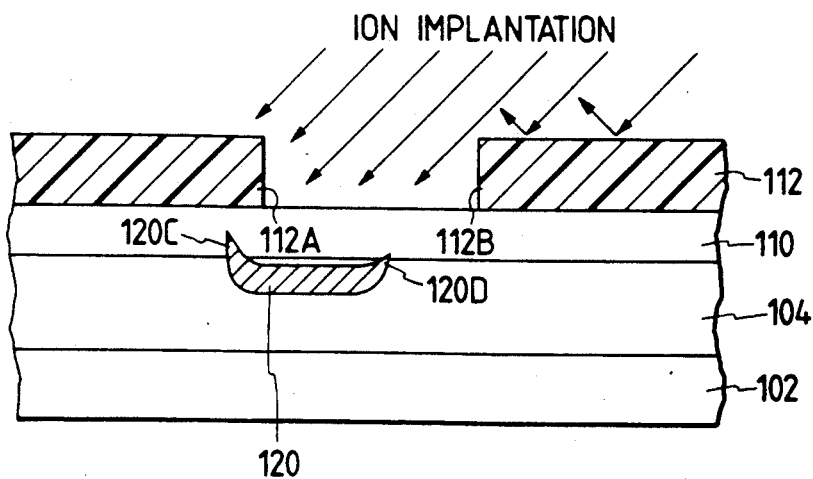
FIG. 6 is a sectional view of a bipolar NPN transistor at a stage during the fabrication which is performed on the basis of a method according to a sixth embodiment of this invention.

As shown in FIG. 6, a silicon dioxide film 112 having an opening is used as a mask while phosphorus ions are obliquely implanted into an epitaxial layer 104 and a base region 110 to form a SIC region 120. The edges 112A and 112B of the mask which define the opening have smaller and varying effective thicknesses along the beam lines of the phosphorus ions so that the edges 120C and 120D of the SIC region 120 extend upward into the base region 110. The edge 120C extending upward into the base region 110 is desired. On the other hand, the edge 120D extending upward into the base region is unnecessary because it causes a decrease in the base width at the area below a central part of an emitter.

As the inclination of the phosphorus ion implantation increases, the phosphorus ions are more reflected by the surfaces of the silicon dioxide film 112 so that the edge 120D of the SIC region 120 less extends into the base region 110. In the sixth embodiment, as shown in FIG. 6, the inclination of the phosphorus ion implantation with respect to the vertical direction perpendicular to the main surfaces of the semiconductor device body is set to 45 or greater degrees to prevent the edge 120D of the SIC region 120 from unacceptably extending into the base region 110.

DESCRIPTION OF THE SEVENTH PREFERRED EMBODIMENT

Figure 7:
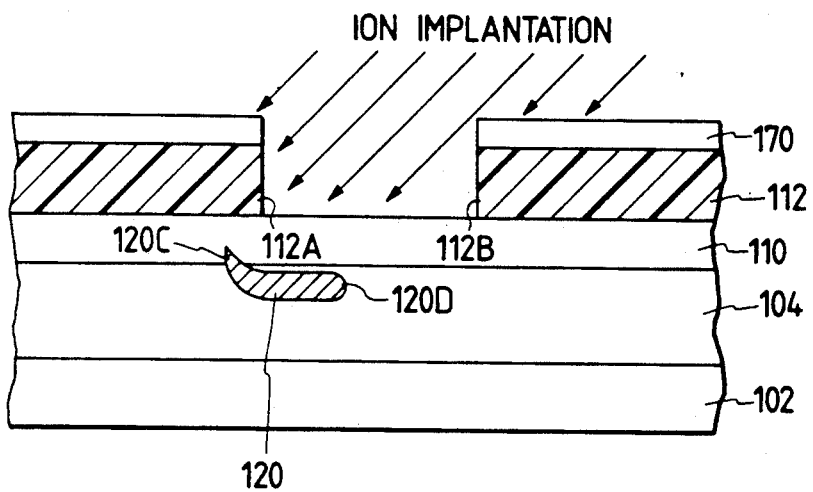

FIG. 7 relates to a seventh embodiment of this invention which is similar to the sixth embodiment except for the following design changes.

In the seventh embodiment, as shown in FIG. 7, an additional mask 170 made of metal such as molybdenum, lead, or tungsten is formed on a silicon dioxide film 112 in a known way. The additional mask 170 has a pattern which agrees with the pattern of the silicon dioxide film 112. The material of the additional mask 170 is chosen from substances which have a high power for stopping implanted ions. Since the additional mask 170 effectively blocks the parts of the phosphorus ion beam which would cause the upwardly intruding edge of the SIC region 120, the edge 120D of the SIC region 120 is prevented from extending upward into the base region 110. Since the part of the phosphorus ion beam which forms the edge 120C of the SIC region 120 does not meet the additional mask 170, the edge 120C of the SIC region 120 can satisfactorily extends upward into the base region 110.

In the seventh embodiment, the inclination of the phosphorus ion implantation is not limited to the range of 45 or greater degrees.

DESCRIPTION OF THE EIGHTH PREFERRED EMBODIMENT

Figure 8:
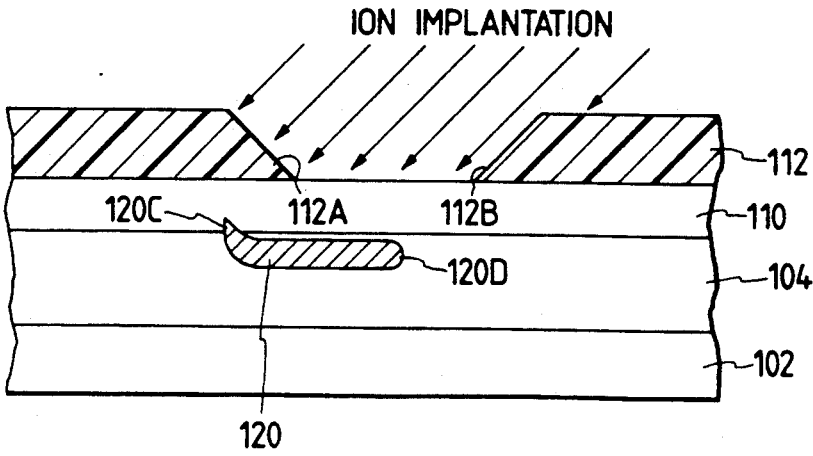
FIG. 8 is a sectional view of a bipolar NPN transistor at stage during the fabrication which is performed on the basis of a method according to an eighth embodiment of this invention.

FIG. 8 relates to an eighth embodiment of this invention which is similar to the sixth embodiment except for the following design changes.

In the eighth embodiment, as shown in FIG. 8, the side surfaces of the edges 112A and 112B of the silicon dioxide film 112 are tapered along directions which substantially agree with the directions of travel of the phosphorus ions during the ion implantations respectively. In the case shown in FIG. 8, the edge 112B of the silicon dioxide film 112 has an uniform effective thickness with respect to the phosphorus ion beam, and the effective thickness of the edge 112B is equal to the effective thickness of the non-edge part of the silicon dioxide film 112. Accordingly, the edge 120D of the SIC region 120 is prevented from extending upward into the base region 110.

What is claimed is:

1. A method of fabricating a semiconductor device, comprising the steps of:
    forming a first semiconductor region of a first conduction type, the first semiconductor region forming a transistor collector;
    forming a second semiconductor region on the first semiconductor region, the second semiconductor region being of a second conduction type and forming a transistor base;
    forming a mask on the second semiconductor region, the mask having an opening for a transistor emitter;
    forming a third semiconductor region in an emitter-forming area within the second semiconductor region, the third semiconductor region being of the first type and forming a transistor emitter; and
    implanting ions into the first and second semiconductor regions via the opening along a direction inclined with respect to a surface of the second semiconductor region and thereby forming a fourth semiconductor region of the first conduction type, the fourth semiconductor region having a main portion and an upper portion, wherein the main portion extends in a part of the first semiconductor region below an edge of the emitter-forming area within the second semiconductor region, the upper portion extends from the main portion into a part of the second semiconductor region, the upper portion not reaching the upper surface of the second semiconductor region, and the surface of the upper portion is shaped so as to conform to the edge of the emitter-forming area to limit a width of the transistor base.

2. The method of claim 1 further comprising the step of forming a fifth semiconductor region being of the first conduction type and adjoining a bottom of a part of the second semiconductor region which extends directly below the third semiconductor region.

3. A method of fabricating a semiconductor device, comprising the steps of:

forming a first semiconductor region of a first conduction type, the first semiconductor region forming a transistor collector;

forming a non-crystalline conductor film on the first semiconductor region;

forming an opening through the conductor film;

forming a second semiconductor region on the first semiconductor region, the second semiconductor region being of a second conduction type and forming a transistor base, the second semiconductor region being electrically connected to the conductor film;

forming a third semiconductor region in an emitter-forming area within the second semiconductor region, the third semiconductor region being of the first type and forming a transistor emitter; and implanting ions into the first and second semiconductor regions via the opening along a direction inclined with respect to a surface of the second semiconductor region and thereby forming a fourth semiconductor region of the first conduction type, the fourth semiconductor region having a main portion and an upper portion, wherein the main portion extends in a part of the first semiconductor region below an edge of the emitter-forming area within the second semiconductor region, the upper portion extends from the main portion into a part of the second semiconductor region , the upper portion not reaching the upper surface of the second semiconductor region, and the surface of the upper portion is shaped so as to conform to the edge of the emitter-forming area to limit a width of the transistor base.

4. The method of claim 3 further comprising the step of forming an insulating film defining sides of the opening for emitter.

5. The method of claim 3 further comprising the step of forming a fifth semiconductor region being of the first conduction type and adjoining a bottom of a part of the second semiconductor region which extends directly below the third semiconductor region.

* * * * *